(12) United States Patent
DeBoer et al.

(10) Patent No.: US 6,872,639 B2
(45) Date of Patent: *Mar. 29, 2005

(54) FABRICATION OF SEMICONDUCTOR DEVICES WITH TRANSITION METAL BORIDE FILMS AS DIFFUSION BARRIERS

(75) Inventors: Scott J. DeBoer, Boise, ID (US); Husam N. Al-Shareef, Al-Ain (AE)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/417,119

(22) Filed: Apr. 17, 2003

(65) Prior Publication Data

US 2003/0203608 A1 Oct. 30, 2003

Related U.S. Application Data

(62) Division of application No. 09/739,270, filed on Dec. 19, 2000, now Pat. No. 6,613,654, which is a division of application No. 09/240,395, filed on Jan. 29, 1999, now Pat. No. 6,614,082.

(51) Int. Cl.[7] .......................... C30B 25/00; H01L 21/36; H01L 21/20
(52) U.S. Cl. ....................... 438/506; 438/239; 438/514; 438/647; 438/649; 438/651; 438/653; 257/68; 257/71; 257/382; 257/768
(58) Field of Search ........................... 438/239, 506, 438/514, 642–649, 651–653, 682–685, 655–656; 257/68–71, 382–388, 751, 768

(56) References Cited

U.S. PATENT DOCUMENTS 3,775,192 A 12/1971 Beale
3,895,392 A 5/1974 Polata et al.
4,153,483 A 5/1979 Hotzl
4,502,209 A 3/1985 Eizenberg et al.

(Continued)

FOREIGN PATENT DOCUMENTS

EP 0 242 100 10/1987

OTHER PUBLICATIONS

Lange et al. "Semiconducting transition metal silicides: elecronic structure, electrical and thermoelectrical properties" 16th Internation conference on thermoelectrics 1997 IEEE p. 267–274.*

J.R. Shappirio et al., "Diboride diffusion barriers in silicon and GaAs technology", J. Vac. Sci. Technol. B, vol. 4, No. 6, Nov/Dec 1986, pp. 1409–1415.

(Continued)

Primary Examiner—Matthew Smith
Assistant Examiner—Granvill David Lee, Jr.
(74) Attorney, Agent, or Firm—Dickstein Shapiro Morin & Oshinsky LLP

(57) ABSTRACT

An integrated circuit has a multi-layer stack such as a gate stack or a digit line stack disposed on a layer comprising silicon. A conductive film is formed on the transition metal boride layer. A process for fabricating such devices can include forming the conductive film using a vapor deposition process with a reaction gas comprising fluorine. In the case of a gate stack, the transition metal boride layer can help reduce or eliminate the diffusion of fluorine atoms from the conductive film into a gate dielectric layer. Similarly, in the case of digit line stacks as well as gate stacks, the transition metal boride layer can reduce the diffusion of silicon from the polysilicon layer into the conductive film to help maintain a low resistance for the conductive film.

17 Claims, 5 Drawing Sheets

U.S. PATENT DOCUMENTS

| | | | |
|---|---|---|---|
| 4,920,071 A | | 4/1990 | Thomas |
| 5,075,757 A | | 12/1991 | Ishii et al. |
| 5,117,276 A | | 5/1992 | Thomas et al. |
| 5,190,888 A | | 3/1993 | Schwalke et al. |
| 5,254,842 A | | 10/1993 | Posner et al. |
| 5,256,583 A | | 10/1993 | Hollinger |
| 5,270,237 A | * | 12/1993 | Sang et al. ............... 438/278 |
| 5,330,921 A | | 7/1994 | Yoshida et al. |
| 5,350,484 A | * | 9/1994 | Gardner et al. ............ 438/669 |
| 5,364,803 A | | 11/1994 | Lur et al. |
| 5,364,804 A | | 11/1994 | Ho et al. |
| 5,382,808 A | | 1/1995 | Dreifus et al. |
| 5,407,852 A | | 4/1995 | Ghio et al. |
| 5,414,301 A | | 5/1995 | Thomas |
| 5,604,140 A | | 2/1997 | Byun |
| 5,652,180 A | | 7/1997 | Shinriki et al. |
| 5,700,716 A | | 12/1997 | Sharan et al. |
| 5,736,455 A | | 4/1998 | Iyer et al. |
| 5,745,990 A | * | 5/1998 | Lee et al. ..................... 29/852 |
| 5,773,350 A | | 6/1998 | Herbert et al. |
| 5,801,425 A | | 9/1998 | Kurol et al. |
| 5,831,335 A | | 11/1998 | Miyamoto |
| 5,874,342 A | | 2/1999 | Tsai et al. |
| 5,926,703 A | | 7/1999 | Yamaguchi et al. |
| 5,969,398 A | * | 10/1999 | Murakami ................. 257/412 |
| 6,100,187 A | * | 8/2000 | Hintermaier et al. ....... 438/653 |
| 6,121,124 A | | 9/2000 | Liu |
| 6,130,145 A | | 10/2000 | Ilg et al. |
| 6,143,658 A | | 11/2000 | Donnelly et al. |
| 6,156,630 A | | 12/2000 | Iyer |
| 6,225,209 B1 | * | 5/2001 | Lin et al. .................... 438/624 |
| 6,613,654 B1 | * | 9/2003 | DeBoer et al. ............. 438/506 |
| 6,614,082 B1 | * | 9/2003 | DeBoer et al. ............. 257/412 |

OTHER PUBLICATIONS

Rosner, et al., "Calculation of Transport–Shifted CVD Phase Diagrams", Materials Research Society Symp. Proc., vol. 168 (1990), pp. 43–48.

Mukaida, et al., "Morphlogy and deposition rates of $TiB_2$ prepared by chemical vapour deposition of $TiCL_4+B_2H_6$ system", Journal of Materials Science, vol. 25 (1990), pp. 1069–1075.

Williams, L.M., "Plasma enhanced chemical vapor deposition of titanium diboride films", Appl. Phys. Let. vol. 46(1), Jan. 1985, pp. 43–45.

Pierson, et al., "Titanium Diboride Coatings and Their Interaction with the Substrates", Thin Solid Films, vol. 54 (1978), pp. 119–128.

Schrey, et al., "Selective Silicide or Boride Film Formation by Reaction of Vapor Phase $TiCL_4$ with Silicon or Boron", J. Electrochem. Soc., vol. 137, No. 5, May 1990, pp. 1647–1649*.

Choi, S.S., "Low Pressure Chemical Vapor Deposition $TiB_2$ for ULSI Applications", North Caroline State University, vol. 5025B of Dissertations Abstracts International, 1991.

Kim, et al., "Preparation of titanium boride films by chemical vapor deposition", Journal of the Korean Institute of Metals, vol. 29, No. 11, pp. 1181–1187 (1991).

Tamari, et al., "Formation of titanium boride by chemical vapor deposition", Kyushu Diaguku Kogaku Shuho (Japan), vol. 49: Aug. 4, 1976, pp. 531–536.

"A Novel Process to Form Colbolt Silicided Poly–si Gates by BF2 Implantation . . . " IEEE Electron Device Letter, vol. 19, No. 7, Jul. 1998, p. 259–261*.

* cited by examiner

FIG. 3
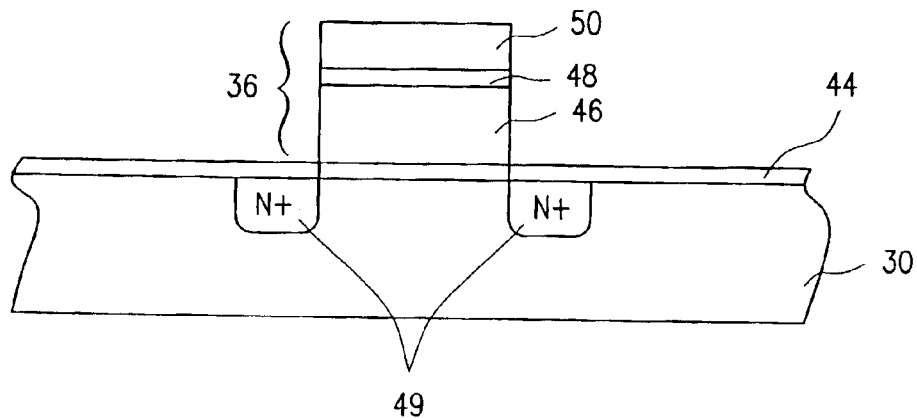
FIG. 4
| BORIDE | RESISTIVITY ($\mu\Omega-cm$) ANNEALED |
|---|---|
| $ZrB_2$ | 25 |
| $TiB_2$ | 150 |
FIG. 5
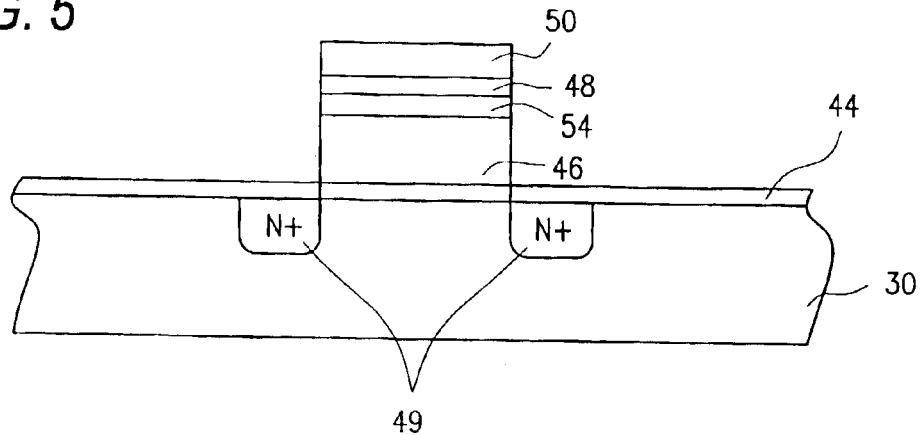

FABRICATION OF SEMICONDUCTOR DEVICES WITH TRANSITION METAL BORIDE FILMS AS DIFFUSION BARRIERS

This application is a continuation of application Ser. No. 09/739,270, filed on Dec. 19, 2000 now U.S. Pat. No. 6,613,654, which in turn is a divisional of Ser. No. 09/240,395, filed on Jan. 29, 1999 now U.S. Pat. No. 6,614,082, the disclosures of which are incorporated by reference herein.

BACKGROUND

The present invention relates generally to semiconductor devices and, more particularly, to the use of transition metal boride films as diffusion barriers in devices such as gate stacks and digit line stacks.

In some semiconductor memory circuits, word lines, which are formed from a uniformly-thick conductive layer, form both gate electrodes and gate interconnections. Whenever a word line passes over a field-oxide region, it functions as a gate electrode interconnection; whenever the word line passes over a gate dielectric layer overlaying an active region, it functions as a gate electrode.

In early generations of integrated circuits, gate electrodes and electrode interconnections were often etched from a heavily-doped polycrystalline silicon (polysilicon) layer. To achieve increased operational speeds and lower stack heights-in subsequent generations of circuits, it was necessary to decrease the sheet resistance of the conductive layer from which the gates and gate interconnections were formed. Recently, the use of pure metal layers formed from materials are being investigated to enhance the conductivity of the polysilicon transistor gates and gate interconnections. Tungsten (W), for example, is of particular interest because it is relatively inexpensive, has a high melting point, and is compatible with current circuit manufacturing processes. Thus, low pressure chemical vapor deposited (LPCVD) tungsten silicide ($WSi_x$) is being investigated in the fabrication of polycide gate structures to form low resistance word lines in semiconductor devices such as dynamic random access memory (DRAM) cells.

As illustrated in FIG. 1A, a wafer includes a semiconductor substrate 10 which may include one or more previously formed layers or active regions. A gate dielectric such as a silicon oxide layer 14 is deposited or grown over the surface of the substrate, and a gate stack 22 is formed over the silicon oxide layer. The gate stack 22 includes a gate polysilicon layer 16 which helps improve the adhesion of a subsequently deposited tungsten silicide film. The gate stack also includes a tungsten silicide layer 18 deposited, for example, by LPCVD over the gate polysilicon layer 16. The polysilicon and tungsten silicide layers 16, 18 are patterned and etched using conventional photo-lithographic techniques to form the polycide gate electrodes. Ion implanted source and drain regions 12 are formed, and the wafer is subjected to an annealing process at an elevated temperature.

$WF_6$ and $SiH_4$ are among the reaction gases typically used during the deposition of the tungsten silicide film 18, and, therefore, fluorine atoms generally are incorporated into the tungsten silicide film 18. When the polycide structure is subsequently annealed at high temperatures, fluorine atoms tend to diffuse through the gate polysilicon 16 into the gate silicon oxide layer 14. The fluorine atoms react with the oxide and break the Si—O bonds to replace the oxygen at those sites. The released oxygen diffuses to the interface of the $SiO_2$ layer 14 and oxidizes the silicon and polysilicon resulting in an increased oxide thickness 20 (FIG. 1B). The additional oxide can cause device degradation, such as a shift in the threshold voltage and a decrease in the saturation current.

Attempts have been made to reduce the diffusion of fluorine into the gate silicon oxide layer by forming a thin film conducting diffusion barrier between the tungsten silicide film 18 and the gate oxide 14. For example, diffusion barriers of materials such as titanium nitride, tantalum nitride and titanium tungsten have been proposed with some success. Nevertheless, room remains for improvement in structures such as gate stacks as well as digit line stacks, among others.

SUMMARY

In general, techniques are disclosed for fabricating semiconductor devices and integrated circuits incorporating a transition metal boride layer. The transition metal boride layer can act as a diffusion barrier to improve the properties of the device.

For example, according to one aspect, a method of fabricating a semiconductor device includes forming a transition metal boride layer on a layer comprising silicon and forming a conductive layer on the transition metal boride layer. The transition metal boride layer can be formed by various techniques, including chemical vapor deposition. In other implementations, a transition metal layer is formed on the layer comprising silicon, and the transition metal layer is exposed to a gas containing boron. Rapid thermal processes as well as plasma treatments can be used to expose the transition metal layer to the boron-containing gas, thereby forming the transition metal boride layer. Alternatively, the transition metal layer can be implanted with boron ions.

According to another aspect, an integrated circuit includes a substrate, a gate dielectric disposed over the substrate and a gate stack disposed on the gate dielectric. The gate stack includes a layer comprising silicon, such as a polysilicon layer, a transition metal boride layer disposed on the layer comprising silicon, and a conductive layer disposed on the transition metal boride layer.

According to yet another aspect, an integrated circuit includes a substrate, a polysilicon layer disposed over the substrate, and a digit line stack disposed on the polysilicon layer. The digit line stack includes a transition metal boride layer disposed on the polysilicon layer and a conductive layer disposed on the transition metal boride layer.

Various implementations include one or more of the following features. The transition metal boride layer can include a material selected from the group consisting of zirconium boride, titanium boride, hafnium boride and tantalum boride. In some implementations, the transition metal boride layer has a resistivity in the range of about 5 to 150 microOhms-centimeter and a thickness preferably less than about 200 angstroms.

The conductive layer can be formed by a process using a reaction gas comprising fluorine. In such cases, the transition metal boride layer can function as a diffusion barrier layer to help reduce or eliminate the diffusion of fluorine atoms from the conductive layer into the polysilicon layer and into the gate dielectric during subsequent processing. Accordingly, the thickness of the dielectric layer does not increase as a result of subsequent annealing or other processes performed at an elevated temperature. The transition metal boride layer also can function as a diffusion barrier layer to reduce diffusion of silicon atoms into the conductive layer. Low resistance can be maintained and high temperature stability can be achieved so that little or no degradation of the device results.

Other features and advantages will be readily apparent from the following detailed description, the accompanying drawings, and the claims.

BRIEF DESCRIPTION OF THE DRAWINGS

FIG. 3 shows a cross-section of a gate stack according to the invention.

FIG. 4 is a table of exemplary resistivity values for some transition metal borides.

FIG. 5 shows a cross-section of a gate stack according to another embodiment of the invention.

DETAILED DESCRIPTION

Figure 1A:
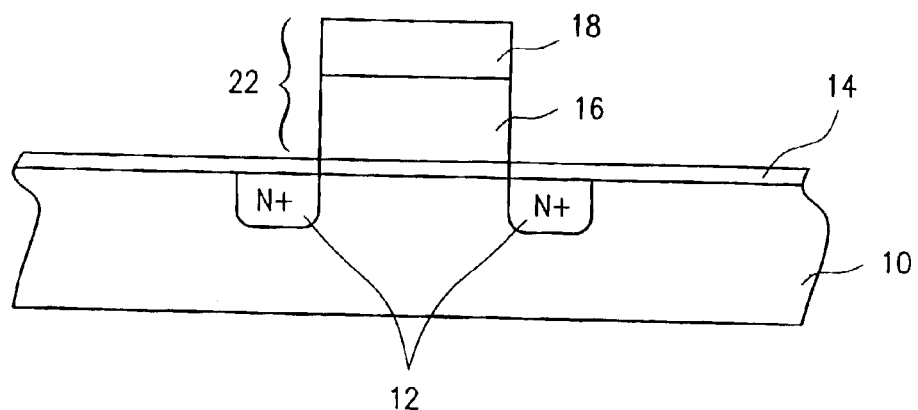
FIGS. 1A and 1B illustrate an exemplary gate stack.
Figure 1B:
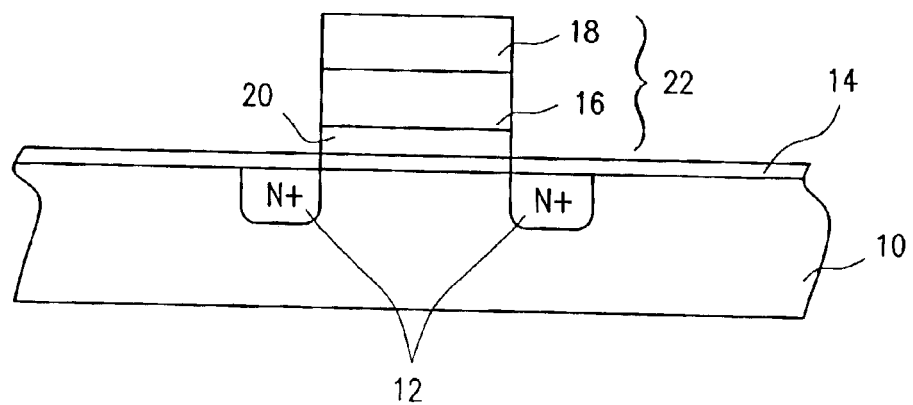
Figure 2:
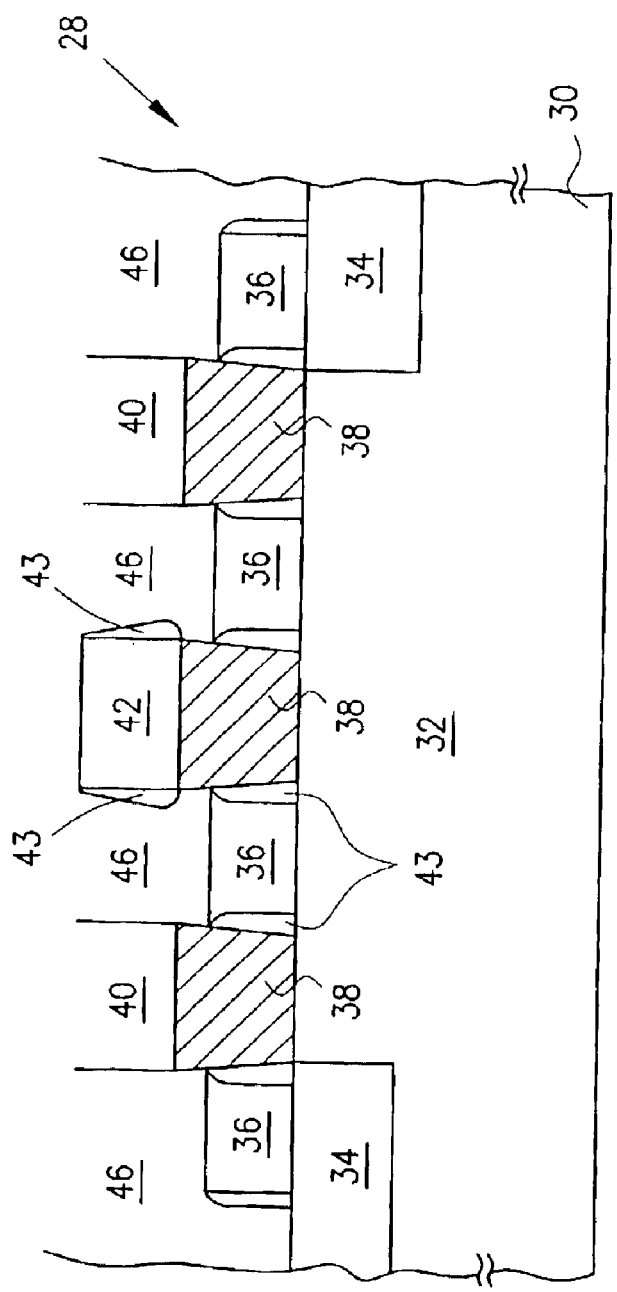
FIG. 2 illustrates a partial cross-section of an exemplary integrated circuit including gate stacks and a digit line stack.

Referring to FIG. 2, an integrated circuit includes a DRAM cell 28. The DRAM 28 is formed on a silicon substrate 30 with an active region 32 and shallow trench isolation regions 34. Multiple word line or gate stacks 36 are formed over the active region 32 as well as over the isolation regions 34, and are separated by polysilicon plugs 38 and dielectric spacers 43. Capacitive cells 40 are provided above some of the polysilicon plugs 38, and a digit line stack 42 is formed over another one of the plugs. A passivation layer 46 comprising boro-phospho silicate glass (BPSG) can be provided over the surface of the device.

Figure 6:
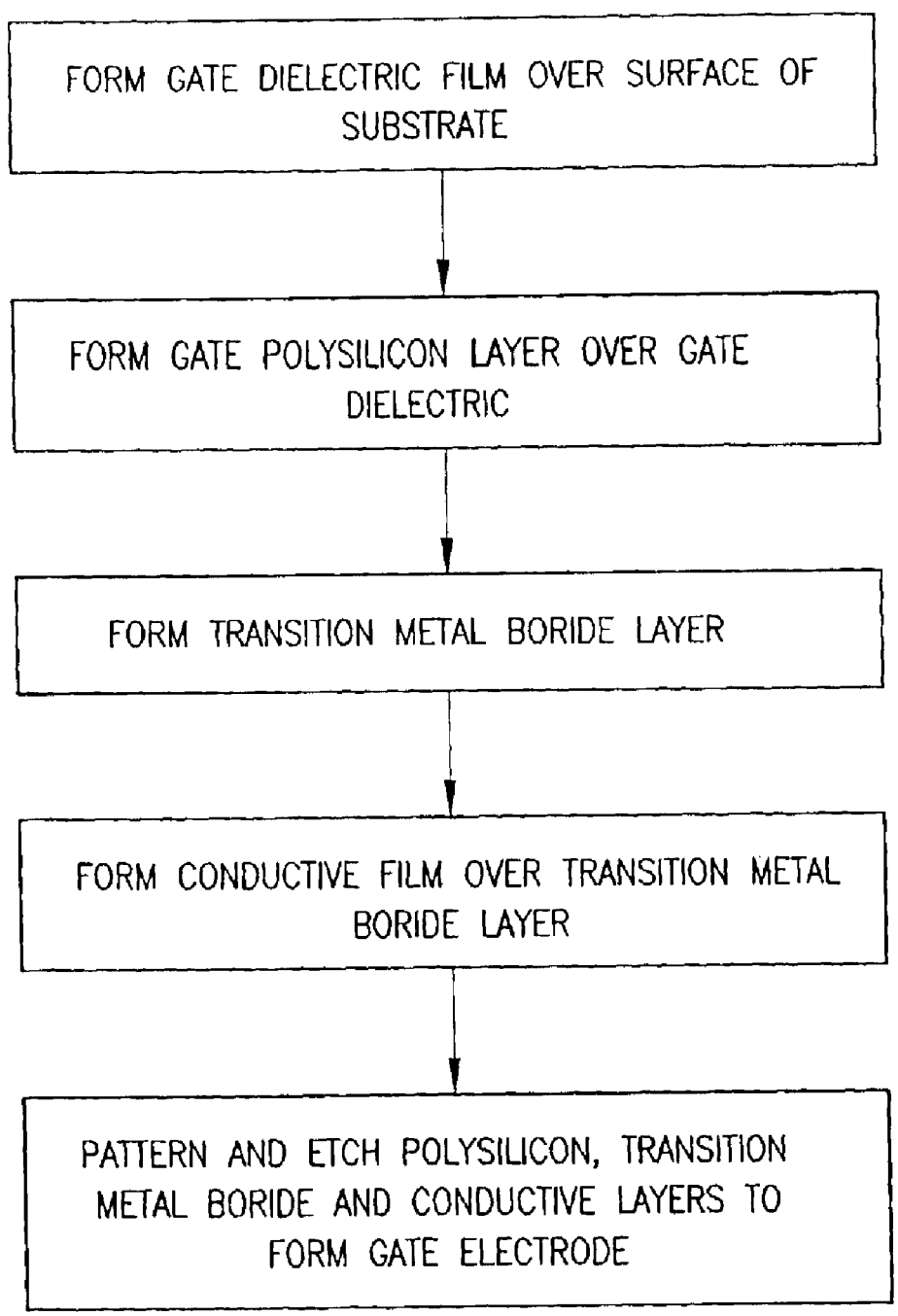
FIG. 6 is a flow chart showing fabrication steps of a gate stack according to the invention.

Referring to FIGS. 3 and 6, further details of the gate stacks 36 are described. A gate dielectric layer 54 is provided on the surface of the monocrystalline silicon substrate 30 which may include other previously-formed layers. In some implementations, the gate dielectric 54, which can comprise, for example, a deposited or thermally grown silicon oxide ($SiO_2$) layer, has a thickness in the range of about 40 to 400 angstroms (Å). Alternatively, the gate dielectric can comprise a nitrided oxide including a material such as nitric oxide (NO), nitrous oxide ($N_2O$), or $NH_3$. In other implementations, the gate dielectric comprises a material with a dielectric constant ($\in$) at least as high as about 4. Such materials include tantalum oxide ($TaO_5$), titanium oxide ($TiO_x$), barium strontium titanate ($Sr_xBa_{1-x}TiO_3$), strontium titanate ($SrTiO_3$) and lead zirconium titanate ($PbZrTiO_3$)

The multi-layer stack 36, which is formed over the gate dielectric 44, includes a gate polysilicon layer 46, a transition metal boride layer 48, and a highly conducting film 50.

In some embodiments, the thickness of the gate polysilicon layer 46 is in the range of about 800 to 4,000 Å, although other thicknesses may be appropriate for particular applications.

The transition metal boride layer 48 includes, for example, a material such as zirconium boride ($ZrB_x$), titanium boride ($TiB_x$), hafnium boride ($HfB_x$) or tantalum boride ($TaBr_x$). Such materials exhibit good adhesion characteristics to silicon. Moreover, due to the relatively low resistivities of about 5–150 microOhms-centimeter ($\mu\Omega$-cm)⁻ of the transition metal borides (see FIG. 4), the total height of the gate stack 36 can be less than that obtained using prior techniques. In some implementations, the thickness of the transition metal boride layer 48 is in the range of about 50 to 400 Å. Preferably, the thickness is less than about 200 Å.

The transition metal boride layer 38 can be formed, for example, using a physical vapor deposition (PVD) technique or a chemical vapor deposition (CVD) technique. A CVD technique can provide improved step coverage, particularly in the case of digit line stacks which are discussed further below.

Alternatively, a thin film of a transition metal, such as titanium (Ti) having a thickness of less than about 300 Å, can be deposited over the polysilicon layer 46 by a PVD or CVD process. The Ti film then can be exposed to a gas containing boron, for example, by placing the wafer in a rapid thermal process (RTP) chamber and providing a flow of $B_2H_6$ or $BF_3$ gas diluted with hydrogen ($H_2$), nitrogen ($N_2$) and/or argon (Ar) gas in the vicinity of the Ti film to form the transition metal boride film 48. In one implementation, the RTP process is performed at a temperature in the range of approximately 300 to 900° C. for a duration of less than about 2 minutes. Using the RTP process allows a thin titanium silicide ($TiSi_x$) film 54 (FIG. 5) to form between the transition metal boride layer 48 and the polysilicon layer 46. The $TiSi_x$ layer 54 serves as a good contact.

In yet another embodiment, a thin film of a transition metal is deposited over the polysilicon layer 46 by a PVD or CVD process. The Ti film then can be exposed to a gas containing boron as part of a plasma treatment at a temperature, for example, in the range of about 250 to 750° C. The plasma treatment can use either a radio frequency (rf) or a direct current (dc) plasma.

In yet a further embodiment, the transition metal boride film 48 is formed by initially depositing a thin film of titanium over the polysilicon layer 46 and by subsequently implanting both the polysilicon layer and the titanium film with boron ions. Thus, a p+ doped polysilicon layer 46 and the transition metal boride film 48 can be formed by a single boron ion implant. $BF_2$ is suitable as the source of boron. Prior to performing the boron ion implant, an annealing step optionally can be performed.

After forming the transition metal boride layer 48, the conductive film 50 is deposited over the transition metal boride layer. The conductive film can comprise a material such as tungsten (W), tungsten silicide ($WSi_x$) or boron-containing tungsten. For example, a tungsten silicide film can be formed by LPCVD using $WF_6$ and $SiH_4$ as the main reaction gases. Alternatively, a material including a transition metal, such as, titanium (Ti), titanium silicide ($TiSi_x$), zirconium (Zr), hafnium (Hf), or a transition metal boride, can be used as the conductive film 50. Similarly, aluminum (Al) or copper (Cu), as well as other materials with a resistivity of less than about ten $\mu\Omega$-cm, can be used as the conductive film 50. In some implementations, the conductive film 50 has a thickness in the range of about 200 to 2,000 Å.

Conventional photolithographic and etching techniques can be used to form the previously-deposited layers 46, 48, 50 into a gate electrode. After the gate electrode patterns have been defined, source and drain regions 49 can be formed, for example, by ion implantation. The wafer then is annealed at a temperature in the range of about 600 to about 900° C. in an ambient of nitrogen ($N_2$) or oxygen ($O_2$) gas.

In some implementations, the polysilicon layer 46 can be omitted with the transition metal boride layer 48 deposited directly on the gate oxide or other dielectric layer 44.

In general, the transition metal boride layer 48 acts as a diffusion barrier and can help reduce or eliminate the diffusion of fluorine atoms from the conductive film 50 into the polysilicon layer 46 and the gate dielectric layer 44. Accordingly, the thickness of the gate oxide layer 44 does not increase as a result of the annealing. Furthermore, the transition metal boride layer 48 can help prevent the diffusion of silicon from the polysilicon layer 46 into the conductive layer 50. For example, the diffusion of silicon from the polysilicon layer 46 into the conductive tungsten film 50 would result in the formation of tungsten silicide thereby increasing the sheet resistance of the word line. Thus, the addition of the transition metal boride layer 48 helps maintain the low resistance of the conductive layer 50. High temperature stability also is achieved so that little or no degradation of the device results.

Figure 7:
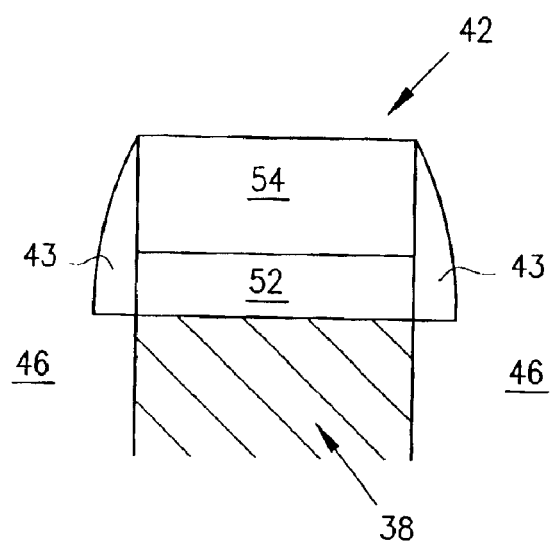
FIG. 7 illustrates a cross-section of an exemplary digit line stack according to the invention.

While the foregoing discussion describes a gate stack structure 36, similar techniques can be used to provide a transition metal boride layer 52 between the polysilicon plug 38 and a conductive film 54 for the digit line stack 42 (FIG. 7). The various techniques described above for forming the transition metal boride layer 48 can be used to form the transition metal boride layer 52 of the digit line stack 42 as well. Similarly, the conductive layer 54 can comprise any of the materials discussed above with respect to the conductive layer 50. The transition metal boride layer 52 can provide advantages similar to those discussed above with respect to the gate stack 36. In particular, the transition metal boride layer 52 can help reduce or eliminate the diffusion of silicon from the polysilicon plug 38 into the conductive layer 54 thereby helping maintain the low resistance of the conductive layer.

Known techniques can be used to complete the BPSG layer 46 and other layers of the integrated circuit.

Other implementations are within the scope of the following claims.

What is claimed is:

1. A method of forming a semiconductor device, comprising:
    forming a transition metal layer on a gate polysilicon layer;
    subjecting the transition metal layer to a gas containing boron as part of a rapid thermal process to implant boron ions in the transition metal layer and in the gate polysilicon layer to form a transition metal boride layer and a doped silicon layer; and
    forming a conductive layer on the transition metal boride layer.

2. The method of claim 1, wherein the rapid thermal process is conducted at a temperature in the range of about 300 to about 900 degrees C.

3. The method of claim 1, further comprising annealing the transition metal layer prior to the implantation.

4. The method of claim 1, wherein the conductive layer is formed using low pressure chemical vapor deposition.

5. The method of claim 4, wherein the conductive layer is formed using at least one member selected from the group consisting of tungsten, tungsten silicide and boron-containing tungsten.

6. The method of claim 4, wherein the conductive layer is formed using at least one member selected from the group consisting of titanium, titanium silicide, zirconium, hafnium and transition metal boride.

7. The method of claim 4, wherein the conductive layer is formed using at least one member selected from the group consisting of titanium, titanium silicide, zirconium, hafnium and transition metal boride.

8. A method of forming a semiconductor device, comprising:
    forming a transition metal layer on a layer comprising silicon;
    subjecting the transition metal layer to a gas containing boron as part of a plasma treatment to implant boron ions in the transition metal layer and in the silicon layer to form a transition metal boride layer and a doped silicon layer; and
    forming a conductive layer on the transition metal boride layer.

9. The method of claim 8, wherein the plasma treatment is conducted at a temperature in the range of about 250 to about 750 degrees C.

10. The method of claim 8, further comprising annealing the transition metal layer prior to the implantation.

11. The method of claim 8, wherein the conductive layer is formed using low pressure chemical vapor deposition.

12. The method of claim 8, wherein the conductive layer is formed using at least one member selected from the group consisting of tungsten, tungsten silicide and boron-containing tungsten.

13. A method of forming a gate stack of a semiconductor device, comprising:
    forming a transition metal layer on a layer comprising silicon;
    annealing the transition metal layer to form an annealed transition metal layer;
    exposing the annealed transition metal layer to a gas containing boron to implant boron ions in the annealed transition metal layer and in the layer comprising silicon to form a transition metal boride layer and a doped silicon layer;
    forming a conductive layer on the transition metal boride layer by providing a reaction gas containing fluorine; and
    etching the transition metal boride layer and the conductive layer to form the gate stack.

14. The method of claim 13, wherein the annealed transition metal layer is exposed to the gas containing boron as part of a rapid thermal process.

15. The method of claim 13, wherein the annealed transition metal layer is exposed to the gas containing boron as part of a plasma treatment.

16. The method of claim 13, wherein a single implant is conducted to implant ions into the annealed transition metal layer and the layer comprising silicon.

17. The method of claim 13, wherein the transition metal boride layer functions as a diffusion barrier layer to reduce diffusion of silicon atoms into the conductive layer.

* * * * *